(12) United States Patent
Christen et al.

(10) Patent No.: US 6,296,701 B1
(45) Date of Patent: Oct. 2, 2001

(54) METHOD OF DEPOSITING AN ELECTRICALLY CONDUCTIVE OXIDE FILM ON A TEXTURED METALLIC SUBSTRATE AND ARTICLES FORMED THEREFROM

(75) Inventors: David K. Christen, Oak Ridge, TN (US); Qing He, Bloomington, MN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/163,888

(22) Filed: Sep. 30, 1998

(51) Int. Cl.$^7$ .................................................. C30B 25/04
(52) U.S. Cl. ........................... 117/94; 117/95; 117/101; 117/106; 117/947; 505/473; 505/474
(58) Field of Search .................... 117/94, 95, 101, 117/106, 947; 505/473, 474

(56) References Cited

U.S. PATENT DOCUMENTS

| | | | |
|---|---|---|---|
| 3,770,497 | 11/1973 | Hassler et al. | 117/212 |
| 5,212,148 | 5/1993 | Roas et al. | 505/1 |
| 5,248,662 | 9/1993 | Yoshida et al. | 505/1 |
| 5,290,761 | 3/1994 | Keating et al. | 505/1 |
| 5,312,804 | 5/1994 | Petitbon et al. | 505/434 |
| 5,372,089 | 12/1994 | Yoshida et al. | 117/98 |
| 5,432,151 | 7/1995 | Russo et al. | 505/474 |
| 5,739,086 | 4/1998 | Goyal et al. | 505/473 |

FOREIGN PATENT DOCUMENTS

| | | | |
|---|---|---|---|
| 697916 | 11/1964 | (CA) | 75/122 |
| 1100-818 | 10/1987 | (JP) | |
| 1100-820 | 10/1987 | (JP) | |
| 6-139848 | 5/1994 | (JP) | |
| 07/211950 | * 8/1995 | (JP) | 117/94 |

OTHER PUBLICATIONS

M. Paranthaman et al., "Growth of Biaxially Textured Buffered Layers on Rolled Ni Substrates by Electron Beam Evaporation", *Physica C.*, 275, 266 (1997).

R.P. Reade et al., "Laser Deposition of Biaxially Textured Yttria–stabilized Zirconia Buffer Layers on Polycrystalline Metallic Alloys for High Critical Current Y–Ba–Cu–O Thin Films",*Applied Physical Letters*, 61, 2231–233 (1992).

D. Dimos et al., "Orientation Dependence of Grain–Boundary Critical Currents in $Yba_2Cu_3O_{7-c}$ Bicrystals",*Physical Review Letters*, vol. 61, No. 2 (Jul. 11, 1988).

D. Dimos et al., "Superconducting Transport Properties of Grain Boundaries in $Yba_2Cu_3O_7$ Bicrystals",*Physical Review B*, 41, 4038 (1990).

(List continued on next page.)

*Primary Examiner*—Robert Kunemund
(74) *Attorney, Agent, or Firm*—Quarles & Brady LLP (57) ABSTRACT

The present invention provides a biaxially textured laminate article having a polycrystalline biaxially textured metallic substrate with an electrically conductive oxide layer epitaxially deposited thereon and methods for producing same. In one embodiment a biaxially texture Ni substrate has a layer of $LaNiO_3$ deposited thereon. An initial layer of electrically conductive oxide buffer is epitaxially deposited using a sputtering technique using a sputtering gas which is an inert or forming gas. A subsequent layer of an electrically conductive oxide layer is then epitaxially deposited onto the initial layer using a sputtering gas comprising oxygen. The present invention will enable the formation of biaxially textured devices which include HTS wires and interconnects, large area or long length ferromagnetic and/or ferroelectric memory devices, large area or long length, flexible light emitting semiconductors, ferroelectric tapes, and electrodes.

3 Claims, 8 Drawing Sheets

OTHER PUBLICATIONS

Y. Iijma, et al., "Structural and Transport Properties of Biaxially Aligned $YBa_2Cu_3O_{7-x}$ Films on Polycrystaline Ni–Based Alloy with Ion–Beam Modified Buffer Layers", *Journal of Applied Physics*, 74, 1905 (1993).

A. Ginsbach et al., "Growth of C–Axis Oriented YbaCuO Films on Oxidized Textured Ni Sheets and on (100) and (110) Oriented NiO Single Crystals",*IEEE Treansactions on Magnetics*, vol. 27, 1410 (1991).

K.M. Satyalakshrni et al., "Epitaxial Metallic $LaNiO_3$ Thin Films Grown by Pulsed Laser Deposition" *Appl. Phys. Lett.* 62 (11), Mar. 15, 1993, p1233.

Ching–Chyuan Yang et al., "Preparation of (100)–oriented Metallic LaNio3 Thin Films on Si Substrates by Radio Frequency Magnetron Sputtering for the Growth of Textured $Pb(Zr_{0.53}Ti_{0.47})O_3$", *Appl. Phys. Lett.* 66 (20), May 15, 1995, p2643.

Dhananjay Kumar et al., "$LaNiO_3$: A Promising Material for Contact with $YBa_2CU_3O_{7-x}$ Thin Films ", *IEEE Transactions on Applied Superconductivity*, vol. 5, No. 4, Dec. 1995, p. 3498.

H. Ichinose et al., "Synthesis of $PbTiO_3$ Films on $LaNiO_3$–coated Substrate by the Spray–ICP Technique", *J. Materials Science* 29 (1994) p5115–5120.

Aidong Li et al., "Preparation of Epitaxial Metallic $LaNiO_3$ Films on $SrTiO_3$ by Metallorganic Decomposition for the Oriented Growth of PbTiO3", *Appl. Phys. Lett.* 69 (2), Jul. 8, 1996.

X. D. Wu et al., "High Current $YBa_2Cu_3Cu_3O_{7-5}$ Thick Films on Flexible Ni Substrates with Textured Buffer Layers", *Appl. Phys. Lett.* 65 (15), Oct. 10, 1994, p. 1961.

R.E. Russo, et al., "Metal Buffer Layers and Y–Ba–Cu–O Thin Films on Pt and Stainless Steel Using Pulsed Laser Deposition", *Journal of Applied Physics*, 68, 1354 (1990).

E. Narumi, et al., "Superconducting $YBa_2Cu_3O_{6.8}$ Films on Metallic Substrates Using In Situ Laser Deposition", *Applied Physics Letters*, 56, 2684 (1990).

J.D. Budai, et al. "In–Plane Epitaxial Alignment of $YBa2-Cu_3-O_{7-x}$ Films Grown on Silver Crystals and Buffer Layers", *Applied Physics Letters*, 62, 1836 (1993).

T.J. Doi, et al., "A New Type of Superconducting Wire; Biaxially Oriented $Tl_1(Ba_{0.8}Sr_{0.2})_2Ca_{2Cu_3}O_9$ ".

D. Forbes, Executive Editor, "Hitachi Reports 1–meter Tl–1223 Tape Made by Spray Pyrolysi", *Superconductor Week*, vol. 9, No. 8, Mar. 6, 1995.

Recrystallization Grain Growth and Textures, Papers presented at a seminar of the American Society for Metals, Oct. 16 and 17, 1965, American Society for Metals, Metals Park, Ohio.

A. Goyal et al., "High Critical Current Density Superconducting Tapes by Epitaxial of $YBa_2Cu_3O_x$ Thick Films on Biaxially Textured Metal Substrates", *Appl. Phys. Lett.*, 69, 1795 (1996).

D. P. Norton et al., "Epitaxial $YBa_2 Cu_3 O_x$ on Biaxially Textured Biaxially Textured (001) Ni: An Approach to High Critical Current Density Superconducting Tape", *Science*, 274, 755 (1996).

K. Sato, et al., "High–$J_c$ Silver–Sheathed Bi–Based Superconducting Wires", *IEEE Transactions on Magnetics*, 27 (1991) 1231.

K. Heine, et al., "High–Field Critical Current Densities in $BI_2Sr_2Ca_1Cu_2O_8$+x/Ag Wires", *Applied Physics Letters*, 55 (1991) 2441.

R. Flukiger, et al., "High Critical Current Densities in Bi(2223)/Ag Tapes", *Superconductor Science & Technology*, 5 (1992) S61.

D. Dijkkamp, et al., "Preparation of Y–Ba–Cu Oxide Superconducting Thin Films Using Pulsed Laser Evaporation from High Te Bulk Material", *Applied Physics Letters*, 51, 619 (1987).

S. Mahajan, et al., "Effects of Target and Template Layer on the Properties of Highly Crystalline Superconducting a–Axis Films of $YBa_2$–$Cu_3$–$O_7$ by DC–Sputtering", *Physica C.*, 213, 445 (1993).

A. Inam, et al., "A–axis Oriented Epitaxial $YBa_2$–$Cu_3$–$O_7PrBa_2Cu_3O_7$ Heterostructures", *Applied Physics Letters*, 57, 2484 (1990).

Tiwari et al., "Epitaxial YBaCuO–delta thin films on SrRuo3pt/MgO", Applied Physics Letters vol 64, No. 5 p. 634–6 abs only, Jan. 1994.*

* cited by examiner

METHOD OF DEPOSITING AN ELECTRICALLY CONDUCTIVE OXIDE FILM ON A TEXTURED METALLIC SUBSTRATE AND ARTICLES FORMED THEREFROM

This invention was made with government support under contract DE-AC05-96OR22464, awarded by the United States Department of Energy to Lockheed Martin Energy Research Corporation, and the United States Government has certain rights in this invention.

FIELD OF THE INVENTION

The present invention is related to biaxially textured metallic substrates and articles made therefrom, and more particularly to methods of forming substrates and articles having a biaxial texture.

BACKGROUND OF THE INVENTION

Since the discovery of superconducting materials having critical temperatures that exceed the temperature of liquid nitrogen, there has been a concerted effort to utilize these materials for various applications, such as in wires and electronic devices. In order to be commercially viable, these applications require high temperature superconducting materials with a high critical current density. Critical current density, $J_c$, is the maximum current density a superconductor can carry at a given temperature and magnetic field. One such high temperature superconducting (HTS) material is a composite oxide of RE, Ba and Cu, (ReBCO) and in particular, $REBa_2Cu_3O_x$ (wherein RE represents at least one of the following rare earth elements: Y, La, Sm, Nd, Eu, Gd, Dy, Ho, Er, Tm, Yb, or Lu).

Current materials research aimed at fabricating high temperature superconducting ceramics in conductor configurations for bulk, practical applications, is largely focused on powder-in-tube methods. Such methods have proven quite successful for the Bi—(Pb)—Sr—Ca—Cu—O (BSCCO) family of superconductors due to their unique mica-like mechanical deformation characteristics. In high magnetic fields, however, this family of superconductors is generally limited to applications below 30° K. In the ReBCO Tl—(Pb, Bi)—Sr—(Ba)—Ca—Cu—O and Hg—(Pb)—Sr—(Ba)—Ca—Cu—O families of superconductors, some of the compounds have much higher intrinsic limits and can be used at higher temperatures.

It has been demonstrated that these superconductors possess a high $J_c$ at high temperatures when fabricated as single crystals or in essentially single-crystal form as epitaxial films on single crystal substrates such as $SrTiO_3$ and $LaAlO_3$. An epitaxial film is one whose crystalline lattice is nearly perfectly aligned with the lattice of the substrate on which it is deposited. These superconductors have so far been intractable to conventional ceramics and materials processing techniques to form long lengths of a polycrystalline conductor with a $J_c$ comparable to epitaxial films. This is primarily because the poor electrical connections at the boundaries between crystalline grains, which is known in the art as the "weak-link" effect.

Thin-film materials having perovskite-like structures are important in superconductivity, ferroelectrics, and electro-optics. Many applications using these materials require, or would be significantly improved by single crystal, c-axis oriented perovskite-like films grown on single-crystal or highly aligned metal or metal-coated substrates. For instance, Y—$Ba_2$—$Cu_3$—O_(YBCO) is an important superconducting material for the development of superconducting current leads, transmission lines, motor and magnetic windings, and other electrical conductor applications. When cooled below their transition temperature, $T_c$, superconducting materials have no electrical resistance and carry electrical current without energy dissipation.

One technique for fabricating a superconducting wire or tape is to deposit a YBCO film on a metallic substrate. Superconducting YBCO has been deposited on polycrystalline metals in which the YBCO is c-axis oriented, but not aligned in-plane. To carry high electrical currents, however, the YBCO films must be biaxially textured, preferably c-axis oriented, with effectively no large-angle grain boundaries, since such grain boundaries are detrimental to the current-carrying capability of the material. YBCO films deposited on polycrystalline metal substrates do not generally meet this criterion.

Many electronic, magnetic, or superconductor device applications require control of the grain boundary character of the device materials. For example, grain boundary character is very important in high temperature superconductors. It is known that the critical current density through a grain boundary may be reduced significantly for misorientation angles greater than 5°–10°. It is thus desirable to obtain superconducting deposits in which the number of grain boundaries with misorientation angles greater than 5°–10° is minimized. For conductors in which the superconducting deposit is epitaxial with an underlying metallic or oxide buffer layer or substrate, it is desirable to minimize the number of grain boundaries with misorientations greater than 5°–10°. This is accomplished if the texture of the substrate has grain orientations which vary by no more than 5°–10°. Useful superconducting layers may be obtained using substrates with a larger spread in grain orientation. However, the properties of the superconductor deposit are expected to improve with a biaxially textured substrate having a narrow spread in grain orientation.

The effects of grain boundary characteristics on current transmission have been clearly demonstrated for certain materials, for example, the material known as YBCO. See Dimos, et al. (1988) Phys. Rev. Left. 61:219; and Dimos, et al. (1990) Phys. Rev. Left. 41:4038. For clean, stoichiometric boundaries, the grain boundary critical current ($J_c(gb)$) appears to be determined primarily by grain boundary misorientation. The dependence of $J_c(gb)$ on misorientation angles for YBCO has been determined by Dimos et al., supra, for grain boundary types which can be formed in epitaxial films on bicrystal substrates. These include [001] tilt, [100] tilt, and [100] twist boundaries. In each case, however, high angle boundaries were found to be weak-linked.

Recently, the Dimos work has been extended to artificially fabricated [001] tilt bicrystals in $Tl_2Ba_2CaCu_2O_8$ (A. H. Cardona, et al., Appl. Phys. Lett., 62 (4), 411, 1993)), $Ndl_{0.85}Ce_{0.15}CuO_4$, $Tl_2Ba_2Ca_2Cu_3O_{x-}$ (M. Kawasaki, et al., Appl. Phys. Lett., 62 (4), 417 (1993)), and $TlBa_2Ca_2Cu_2O_{x-}$ (T. Nabatame, et al., Appl. Phys. Lett. 65 (6), 776 (1994)). In each of these cases, it was found that, as in the case of YBCO, $J_c$ depends strongly on grain boundary misorientation angle. Although no measurements have been made on the material known as Bi-2223, data on current transmission across artificially fabricated grain boundaries in the material termed Bi-2212 indicate that most large angle [001] tilt (M. Kawasaki, et al., Appl. Phys. Left., 62 (4), 417 (1993)) and twist boundaries are weak links, with the exception of some coincident site lattice (CSL) related boundaries (N. Tomita, et al., Jpn. J. Appl. Phys., 29 (1990) L30; N. Tomita, et al., Jpn. J. Appl. Phys., 31, L942 (1992); J. L. Wang, et al., Physica C, 230, 189 (1994)). It is likely that the variation in $J_c$ with [001] tilt grain boundary misorientation in materials Bi-2212 and Bi-2223 is similar to that observed in the well characterized cases of YBCO and Tl-based superconductors.

Hence, in order to fabricate high temperature superconductors with a high $J_c$ it is necessary to have a good biaxial texture. This has been shown to result in significant improvement in the superconducting properties of YBCO films. Y. Iijima, et al., Appl. Phys., 74, 1905 (1993); R. P. Reade et. al., Appl. Phys. Lett., 61, 2231 (1992); X. D. Wu, et al., Appl. Phys. Lett., 65, 1961 (1994).

Methods have been developed to biaxially texture ReBCO to obtain a high $J_c$. High $J_c$'s have been reported in polycrystalline ReBCO in thin films deposited in special substrates on which a biaxially textured non-superconducting oxide buffer layer is first deposited using ion-beam assisted deposition (IBAD) techniques. High $J_c$'s have also been reported in polycrystalline ReBCO melt-processed bulk material which contains primarily small angle grain boundaries.

Recent developments in biaxially textured metallic substrates such as Rolling Assisted Biaxially Textured Substrates (RABiTS), such as described in U.S. Pat. No. 5,739,086, which is fully incorporated by reference herein, and IBAD on Hastelloy have enabled the fabrication of high $J_c$ high temperature superconductors (HTS) including $YBa_2Cu_3O_x$ and (Tl, Bi)-1223.

Specifically, in the area of high-temperature superconductor (HTS) wires for power applications, the superconducting materials must be biaxially oriented to assure large critical current densities. These requirements can be satisfied by deposition of HTS films on biaxially oriented substrates. An attractive candidate substrate is thermo-mechanically biaxially textured Ni, which is inexpensive, possesses good mechanical properties, has a high melting temperature (1455° C.), and a relatively good oxidation resistance. Unfortunately, direct epitaxy of HTS materials on Ni substrates is exacerbated by chemical reaction and oxidation of the Ni at high temperatures, and by the large crystalline lattice mismatch with all HTS materials. The present invention solves these problems, providing biaxially oriented buffer layers that are chemically and structurally compatible with the subsequent HTS materials.

In general, biaxially-oriented oxide films are epitaxially grown at high temperature and in an oxygen atmosphere. Such deposition conditions may cause oxidation of a non-oxide substrate surface. These effects degrade texturing of films deposited on metallic substrates. X. D. Wu et al have successfully deposited yttria-stabilized-zirconia (YSZ) buffer layers on polycrystalline Ni substrates at room temperature by using ion beam assisted deposition (IBAD), which can solve the oxidation problem. X. D. Wu et al., "High Current $YBa_2Cu_3O_{7-\delta}$ Thick Films On Flexible Ni Substrates With Textured Buffer Layers", Appl. Phys. Lett. 65 (15), Oct. 10, 1994, p 1961. However, IBAD is a complex process, which limits its practical applications. In addition, there is no epitaxial relationship between the Ni substrate and the film.

Buffer layers play an important role in superconducting devices, such as a high $T_c$ superconducting laminate tape which consists of high $T_c$ superconducting film, buffer layers, and textured metal substrate. The buffer layers are used not only to transfer the biaxially oriented structure from the substrate to the top high $T_c$ superconducting film, but also to protect the high $T_c$ superconducting film from contamination from the underlying substrate. Insulating buffer layers such as $CeO_2$ and $SrTiO_3$ crack during high temperature annealing, reducing the efficiency of the HTS material. Moreover, insulating buffer layer such as $CeO_2$, $SrTiO_3$, and YSZ, cannot electrically stabilize the HTS conductor layer during transient loss of superconductivity.

Transient loss of superconductivity may cause the superconducting device to overheat. Unstable transient loss of superconductivity may cause portions of the superconducting material to vaporize. An electrically conducting oxide buffer layer would solve the above problems. However, successful deposition of an electrical conductive oxide buffer layer on a biaxially textured polycrystalline metallic substrate has not been disclosed heretofore.

One particular conducting material, $LaNiO_3$, is reported by Kumar et al., "$LaNiO_3$: A Promising Material for Contact with $YBa_2CU_3O_{7-x}$ Thin Films" IEEE Transactions on Applied Superconductivity, Vol. 5, No. 4, December 1995, p. 3498, to have been successfully deposited on YBCO for use as an electrical contact material. This use of $LaNiO_3$ as an electrical contact material is a significantly different use than described herein because the deposition of YBCO on the buffer layer must occur under conditions where the YBCO will form (high temperature and oxygen partial pressure). For electrical contacts, the $LaNiO_3$ can be deposited at lower temperatures on YBCO that has already been formed.

Epitaxial deposition of $LaNiO_3$ and deposition of oxides on $LaNiO_3$ has been disclosed in H. Ichinose et al., "Synthesis of $PbTiO_3$ film on $LaNiO_3$-coated substrate by the spray-ICP technique" J. Materials Science 29 (1994) p5115–5120; Aidong Li et al., "Preparation of Epitaxial Metallic $LaNiO_3$ Films on $SrTiO_3$ by Metallorganic Decomposition for the Oriented Growth of PbTiO3" Appl. Phys. Lett. 69 (2), Jul. 8, 1996; and K. M. Satyalakshrni et al.,"Epitaxial Metallic LaNiO3 Thin Films Grown by Pulsed Laser Deposition", Appl. Phys. Lett. 62 (11), Mar. 15, 1993, p1233. However, in all of these applications, the epitaxial films are deposited on insulating single crystals.

For further background information, refer to the following publications:
1. K. Sato, et al., "High-$J_c$ Silver-Sheathed Bi-Based Superconducting Wires", JEFE Transactions on Magnetics, 27 (1991) 1231.
2. K. Heine, et al., "High-Field Critical Current Densities in $Bl_2Sr_2Ca_1Cu_2O_8$+x/Ag Wires", Applied Physics Letters, 55 (1991) 2441.
3. R. Flukiger, et al., "High Critical Current Densities in Bi(2223)/Ag Tapes", Superconductor Science & Technology, 5 (1992) S61.
4. D. Dijkkamp, et al., "Preparation of Y—Ba—Cu Oxide Superconducting Thin Films Using Pulsed Laser Evaporation from High Te Bulk Material", Applied Physics Letters, 51, 619 (1987).
5. S. Mahajan, et al., "Effects of Target and Template Layer on the Properties of Highly Crystalline Superconducting a-Axis Films of $YBa_2$—$Cu_3$—$O_7$ by DC-Sputtering", Physica C., 213, 445 (1993).
6. A. Inam, et al., "A-axis Oriented Epitaxial $YBa_2$—$Cu_3$—$O_7$Heterostructures", Applied Physics Letters, 57, 2484 (1990).
7. R. E. Russo, et al., "Metal Buffer Layers and Y—Ba—Cu—O Thin Films on Pt and Stainless Steel Using Pulsed Laser Deposition", Journal of Applied Physics, 68,1354 (1990).
8. E. Narumi, et al., "Superconducting $YBa_2Cu_3O$__Films on Metallic Substrates Using In Situ Laser Deposition", Applied Physics Letters, 56, 2684 (1990).

9. J. D. Budai, et al. "In-Plane Epitaxial Alignment of YBa$_2$—Cu$_3$—O$_7$ Films Grown on Silver Crystals and Buffer Layers", Applied Physics Letters, 62,1836 (1993).
10. T. J. Doi, et al., "A New Type of Superconducting Wire; Biaxially Oriented Tl1 (Ba$_{0.8}$S$_{r0.2}$)$_2$Ca$_2$Cu$_3$O$_7$ on [100] <100> Textured Silver Tape", Proceedings of 7th International Symposium on Superconductivity, Fukuoka, Japan, Nov. 8–11, 1994.
11. D. Forbes, Executive Editor "Hitachi Reports 1-meter Tl-1223 Tape Made by Spray Pyrolysis", Superconductor Week, Vol. 9, No. 8, Mar. 6, 1995.
12. Recrystallization Grain Growth and Textures, Papers presented at a seminar of the American Society for Metals, Oct. 16 and 17, 1965, American Society for Metals, Metals Park, Ohio.
13. A. Goyal et al., "High Critical Current Density Superconducting Tapes by Epitaxial of YBa$_2$Cu$_3$O$_x$ Thick Films on Biaxially Textured Metal Substrates", Appl. Phys. Lett., 69, 1795 (1996).
14. D. P. Norton et al., "Epitaxial YBa$_2$Cu$_3$O$_x$ on Biaxially Textured Biaxially Textured (001) Ni: An Approach to High Critical Current Density Superconducting Tape", Science, 274, 755 (1996).
15. M. Paranthaman et al., "Growth of Biaxially Textured Buffered Layers on Rolled Ni Substrates by Electron Beam Evaporation" Physica C., 275, 266 (1997).
16. K. M. Satyalakshrni, R. M. Mallya, K. V. Ramanathan, X. D. Wu, B. Brainard, D. C. Gautier, N. Y. Vasanthacharya and M. S. Hegde: "Epitaxial Metallic LaNiO$_3$ Thin Films Grown by Pulsed Laser Deposition" Appl. Phys. Lett. 62 (11), Mar. 15, 1993, p1233.
17. Ching-Chyuan Yang, Ming-Sen Chen, Tian-Jue Hong, Chii-Ming Wu, Jenn-Ming Wu, and Tai-Bor Wu, "Preparation of (100)-oriented Metallic LaNiO$_3$ Thin Films on Si Substrates by Radio Frequency Magnetron Sputtering for the Growth of Textured Pb(Zr$_{0.53}$Ti$_{0.47}$)O$_3$", Appl. Phys. Lett. 66 (20), May 15, 1995, p2643.
18. Dhananjay Kumar, K. M. Satyalakshmi, M. S. Hegde, Prakash R. Apte, and Richard Rinto, "LaNiO$_3$: A Promising Material for Contact with YBa$_2$CU$_3$O$_{7-x}$ Thin Films", IEEE Transactions on Applied Superconductivity, Vol. 5, No. 4, December 1995, p. 3498.
19. H. Ichinose, M. Nagano, H. Katsuki, and H. Takagi, "Synthesis of PbTiO$_3$ Film on LaNiO$_3$-coated Substrate by the Spray-ICP Technique", J. Materials Science 29 (1994) p5115–5120.
20. Aidong Li, Chuanzhen Ge, and Peng Lu, "Preparation of Epitaxial Metallic LaNiO$_3$ Films on SrTiO$_3$ by Metallorganic Decomposition for the Oriented Growth Of PbTiO3", Appl. Phys. Lett. 69 (2), Jul. 8, 1996.
21. X. D. Wu, S. R. Foltyn, P. Arendt, J. Townsend, C. Adams, I. H. Campbell, P. Tiwari, Y. Coulter, and D. E. Peterson,"High Current YBa$_2$Cu$_3$O$_{7-\delta}$ Thick Films on Flexible Ni Substrates with Textured Buffer Layers", Appl. Phys. Lett. 65 (15), Oct. 10, 1994, p 1961.

BRIEF SUMMARY OF THE INVENTION

The present invention provides a biaxially textured laminate article having a polycrystalline biaxially textured conductive substrate with an electrically conductive oxide layer epitaxially deposited thereon. Thus, a general objective of providing a laminated article having an electrically conductive buffer layer epitaxially deposited on a polycrystalline biaxially textured substrate is accomplished.

Another objective of the present invention is to provide a biaxially textured laminate article useful for superconductors having a buffer layer which stabilizes a transitioning superconductor layer deposited thereon. This objective is accomplished by providing an electrically conductive oxide buffer layer having a biaxial texture on which a superconducting material can be epitaxially deposited thereon.

Another objective of the present invention is to provide a method of epitaxially depositing an electrically conductive oxide buffer layer onto a metallic substrate. This objective is accomplished by depositing an epitaxial layer of a first electrically conductive oxide film on a biaxially textured metallic substrate in the presence of a first sputtering gas; substituting the first sputtering gas with a second sputtering gas; and depositing an epitaxial layer of a second electrically conductive oxide film on a surface of the first electrically conductive oxide film in the presence of said second sputtering gas.

Still another objective of the present invention is to provide a method of epitaxially depositing an electrically conductive oxide buffer layer onto a metallic substrate without forming metal oxide contaminants on the metal substrate. This objective is accomplished by epitaxially depositing an initial layer of an electrically conductive oxide onto the biaxially textured metallic substrate in the presence of a sputtering gas which is inert or a forming gas.

Further objects of the invention will become apparent from the description and figures provided herein.

DETAILED DESCRIPTION OF THE INVENTION

A biaxially textured laminate article is formed from a biaxially textured conductive substrate having an electrically conductive oxide buffer layer epitaxially deposited thereon. The metallic substrate with the epitaxially deposited electrically conductive oxide is chemically and structurally compatible with subsequent epitaxial deposition of other electronic oxide or device films.

The biaxially textured substrate is formed from an electrically conductive material, such as a metal or an electrically conductive oxide. Preferably, the substrate is a metal, such as Ni, Cu, Ag, Pt, Nb, Al, Fe or alloys thereof. Other properties of a particular substrate may enhance the laminate article, for example, a thin, flexible Ni tape provides a laminate article which is flexible as well.

The biaxially textured substrate is preferably formed using the RABiTS technique from materials such as fully described in U.S. Pat. No. 5,739,086, which has been fully incorporated herein, and U.S. patent application Ser. No. 08/934,328, which is fully incorporated herein by reference. Although the RABiTS technique and compatible materials are described herein, other procedures may be used to provide textured substrates, such as IBAD, Off-Axis-Deposition techniques, or the like, without departing from the scope of the present invention.

The degree of biaxial texture of a substrate can be characterized by the population of low misorientation angle grain boundaries in the substrate.

The population of low misorientation angle grain boundaries can be determined using an x-ray diffraction phi scan.

An x-ray diffraction phi scan measures the diffracted intensity of x-rays directed at a material as it is rotated about an axis. The axis of rotation is customarily referred to as the phi axis. If the material has good biaxial texture, that is a large population of low misorientation angle grain boundaries, the diffraction intensity is peaked at orientations corresponding to the texture axes.

The width of an x-ray diffraction phi scan peak correlates with the population of low misorientation angle grain boundaries in a material. As the population of grain boundaries having high misorientation angles increases, the width of the peak increases. Correspondingly, as the population of grain boundaries having low misorientation angles increases, the peak width narrows. Preferably, the biaxially textured substrate of the present invention is characterized by a x-ray diffraction phi scan peak width of no more than 30° FWHM. Most preferably, a biaxially textured material has a x-ray diffraction phi scan peak width of no more than 20° FWHM.

The electrically conductive oxide buffer is epitaxially deposited onto the metallic substrate. Buffer layers play an important role in high $T_c$ superconducting devices, such as a high $T_c$ superconducting laminate tape which consists of high $T_c$ superconducting film, buffer layers, and textured metal substrate. They are used not only to transfer the biaxially oriented structure from the substrate to the top high $T_c$ superconducting material, but also to protect the high $T_c$ superconducting material from substrate contamination.

In contrast to insulated buffer layers such as $CeO_2$, $SrTiO_3$, and YSZ, the electrically conductive oxide buffers of the present invention have a low electrical resistivity which is comparable to that of the subsequently deposited superconductor and stabilizes the superconductor during a transition loss from superconductivity. For example, $LaNiO_3$, is an electrically conductive buffer layer since its electrical resistivity is less than $1 \times 10^{-3}$ Ωcm at room temperature (room temperature is approximately 23° C.), which is comparable to that of YBCO, and it has positive temperature dependence of resistivity. Advantageously, unlike some other buffer layers such as $CeO_2$ and $SrTiO_3$ which are cracked during high temperature annealing, the $LaNiO_3$ is a crack-free buffer layer at high temperature as deposited on a Ni substrate.

Perovskite-like electrically conductive buffer layers, such as $LaNiO_3$, $La_2NiO_4$, $SrRuO_3$ and other electrically conductive perovskite-like oxide materials, can be epitaxially deposited onto the metallic substrate. $LaNiO_3$ is a desired buffer layer since it has a very similar lattice parameter (a=3.83 Å) to high $T_c$ superconductors such as YBCO, which has a-axis lattice parameter of 3.88 Å. The similarity in a-axis lattice parameters ensures good epitaxy. $La_2NiO_4$ has a similar a-axis lattice parameter and higher decomposition temperature than the preferred $LaNiO_3$, but is not as electrically conductive.

Prior to epitaxially depositing the electrically conductive oxide layer onto the substrate, a substrate surface is cleaned. For example, a biaxially textured Ni substrate is preferably cleaned with detergents, organic solvents, etchants, ion sputtering or the like. Additional procedures, such as annealing the substrate to remove metallic oxides and other impurities, is then performed. A Ni substrate, for example, is annealed in vacuum, in hydrogen gas, or in a hydrogen gas mixture at a temperature in the range of about 200° C.–1200° C., preferably in the range of about 600° C.–900° C., for about 15–4 hours, in order to reduce any NiO on or in the textured substrate and to remove various other impurities such as sulfur and carbon from the Ni substrate.

After the anneal, the electrically conductive oxide buffer layer is epitaxially deposited onto the cleaned substrate surface. It is well known that reactive metal substrates, such as Ni, are easily oxidized during the deposition of oxide films. The oxidation degrades epitaxy of the oxide film. Preferably, the in-plane c-axis oriented electrically conductive oxide buffer is deposited on the metallic biaxially textured substrate using a sputtering technique, such as radio frequency (RF) magnetron sputtering. However, is other methods which can deposit an initial oxygen-deficient layer of an electrically conductive oxide can be employed to deposit the biaxially textured film. Without departing from the scope of the present invention, such methods include pulsed laser deposition, evaporation or CVD techniques.

In one embodiment, to overcome the oxidation problem, a first layer of the electrically conductive oxide is deposited by radio frequency magnetron sputtering using a sputtering gas, such as an inert gas or forming gas, for an initial layer deposition of an oxygen-deficient electrically conductive oxide.

This step is followed by further deposition in a sputtering gas comprising $O_2$. The sputtering technique using a forming gas is fully described in U.S. patent application Ser. No. 08/670871, filed on Jun. 26, 1996, which is fully incorporated herein by reference.

One such sputtering technique is a RF magnetron sputtering system using a sputtering gas. Preferably, the system has two sputter targets disposed in a film deposition chamber. A heater block substrate holder is disposed above the targets on a rotation table, so that the substrate is located above either of the two targets (this feature enables sequential sputtering of different layers).

The film deposition chamber is an airtight chamber in which the deposition procedure is conducted. Preferably, the film deposition chamber has a background base pressure of less than $10^{-6}$ Torr prior to introducing a sputtering gas into the chamber. The flowing sputtering gas is pumped into and out of the film deposition chamber during sputtering resulting in a total pressure inside the chamber preferably about $2\times10^{-4}$–$2\times10^{-1}$ Torr.

The sputter targets are disposed inside the film deposition chamber. The targets are containers which contain a target material, such as the electrically conductive oxide buffer material. For example, an electrically conductive oxide buffer, such as $LaNiO_3$, is sputtered from a target that is made by lightly packing $LaNiO_3$ powder into a copper tray. The targets are oriented so that the target material is sputtered upward.

The substrate holder is disposed inside the film deposition chamber and holds the substrate in position above one of the sputter targets and is heated to maintain a substantially constant suitable substrate temperature. Preferably, the holder can maintain temperatures up to at least 800° C. The substrate is mounted on the holder by suitable structure, such as small mechanical clips, inside the film deposition chamber.

RF power is applied to the sputter targets, causing an ionization of the sputtering gas, which bombards the target material and ejects (sputters) atoms or molecules of the target material onto the substrates. The term "magnetron" comes from the fact that there are strong permanent magnets located just below the target disk, which causes the ionization plasma to be more confined and concentrated at the target, thereby giving higher sputter rates than would be obtained without the magnetron.

The sputtering gas provides mass to bombard the target during the sputtering process. During sputtering, the sputtering gas pressure in the chamber is controlled dynamically by pumping the flowing gas into and out of the chamber at a steady pressure. The sputtering gas can be an inert gas, forming gas, or any gas which provides suitable mass for the sputtering process.

An inert sputtering gas, such as Ar, prevents the formation of metallic oxides on the metal substrate during sputtering, but does not reduce or eliminate metallic oxides which have formed on the metal substrate prior to the sputtering operation. A forming gas is an inert gas containing a small amount of $H_2$. The $H_2$ in the inert gas combines with oxygen in any metallic oxides formed on the metal substrate to form water vapor to reduce the metallic oxides on the substrate. The concentration of $H_2$ in the forming gas is usually selected to be low enough to avoid an inadvertent explosion due to the presence of the explosive hydrogen.

Prior to initiating deposition of the first electrically conductive oxide layer onto the metallic substrate, the sputtering apparatus is energized to ionize the sputtering gas and to ensure that the apparatus is operating at a steady state during the deposition process. This procedure is known as pre-sputtering. After pre-sputtering for about 10 min, the electrically conducting oxide is preferably deposited at a temperature between about 100° C. and 750° C., and most preferably in the range of about 350° C.–450° C.

To minimize the formation of a metal oxide, such as NiO on a Ni substrate, the initial layer of the electrically conductive oxide buffer is first deposited with sputtering gas of either a forming or inert gas. An initial deposition of electrically conductive oxide of at least 10 Å is preferred. However, only a monomolecular layer of the electrically conductive oxide may be necessary to protect the underlying metallic substrate from oxidation. When depositing the electrically conductive oxide the initial layer is oxygen deficient, but is (100) oriented with a pseudo-cubic structure. Most preferably, an initial layer of between about 10–1000 521 is deposited.

Once the initial layer of the electrically conductive oxide is epitaxially deposited onto the metallic substrate, a second layer of an electrically conductive oxide is epitaxially deposited onto a surface of the first layer. The second layer is deposited using a sputtering gas which includes $O_2$ to fully oxygenate the electrically conductive oxide. Although pure $O_2$ could be used as the sputtering gas for the second layer, the $O_2$ is preferably mixed with a heavy inert gas, such as Ar, to provide additional mass to bombard the substrate.

When depositing $LaNiO_3$, the deposition rate is preferably between about 0.1–10 Å/sec. The total thickness of the $LaNiO_3$ film is preferably at least about 500 Å, and most preferably at least about 4000 Å. A YSZ layer can be further deposited on the $LaNiO_3$ film at temperature from about 600° C.–800° C. using a forming gas.

Biaxially textured laminate articles according to the invention can be useful in many applications, such as in superconductors, semiconductors, ferroelectrics, pyroelectrics, magnetics, optics, sensors, memories or other areas which use electrically conductive oxides deposited on a substrate. For example, specific devices which may incorporate the present invention include HTS wires and interconnects; large area or long length ferromagnetic and/or ferroelectric memory devices; large area and long length, flexible light emitting semiconductors; ferroelectric tapes; and photovoltaic and thermophotovoltaic devices, such as used in power generation.

Additionally, the present invention may be incorporated in numerous other devices, for example, semiconductor films for electronics and optoelectronics, such as GaAs, GaN, and the like. Phosphors and electroluminescent films may incorporate the present invention for optical and flat panel displays. Ferroelectric films for nonlinear optics, such as $(PbZr)TiO_3$, may be used with the present invention. The present invention may also be used with magnetic oxide films, such as the garnet, $(BiDy)_3(FeGa)_5O_{12}$, for microwave integrated circuits and magnetic and magneto-optical recording. Of course, substitutional alloys of the above materials having similar properties may also be used with the present invention to produce useful devices.

One particular application of the biaxially oriented laminated article of the present invention is in pyroelectric devices, such as described in H. Ichinose et al, "Synthesis of $PbTiO_3$ film on $LaNiO_3$-coated substrate by the spray-ICP technique" J. Materials Science 29 (1994) p5115–5120. The pyroelectric property of $PbTiO_3$ requires (001) orientation because the polarization axes are parallel to (001). Although noble metals such as Pt or Pd have been used as the electrodes for $PbTiO_3$ capacitors, there remain some problems, including economics, weak adhesion to the substrate, and contamination by the interdiffusion from the substrates. Advantageously, a perovskite-like electrically conductive buffer, such as $LaNiO_3$, has a perovskite structure similar to $PbTiO_3$ and shows a metallic conductivity. Therefore, laminate articles of the present invention are expected to be favored for bottom electrodes in $PbTiO_3$ dielectric film devices.

EXAMPLE 1

Deposition of $LaNiO_3$ on a Ni Substrate Initially in the Presence of a Forming Gas.

A biaxially textured Ni substrate was first cleaned using acetone and methanol, and mounted on the substrate holder in the film deposition chamber. The film deposition chamber was then evacuated to a vacuum of approximately $1\times10^{-7}$ Torr. High purity forming gas was introduced into the chamber to about $8 \times 10^{-2}$ Torr. The Ni substrate was then heated to 400° C. An initial 100 Å thick layer of $LaNiO_3$ was then deposited by radio frequency sputtering in the forming gas at a pressure of $8 \times 10^{-2}$ Torr.

After the deposition of the initial oxide layer, flowing pure Ar gas was introduced into the chamber and the flow of the forming gas was shut off. Subsequently, flowing $O_2$ was introduced into the chamber creating a 10% $O_2$/90% Ar flowing mixture at a pressure of $6 \times 10^{-3}$ Torr for additional $LaNiO_3$ deposition. During the transition in the sputtering gas, sputter deposition of the $LaNiO_3$ at a RF power of 65W continued. The deposition rate was 0.5 Å/sec. and the final thickness was about 4000 Å.

Figure 1:
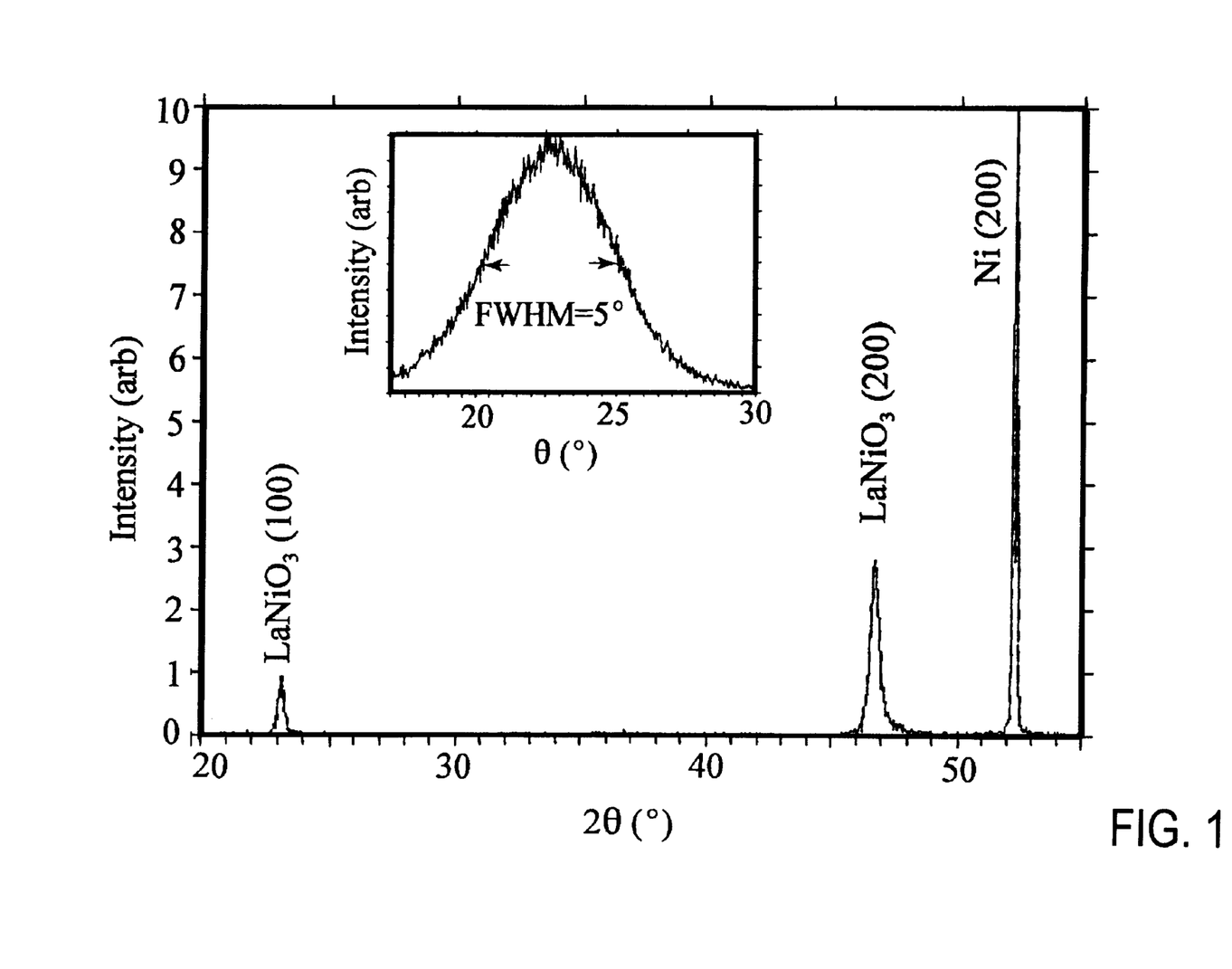
FIG. 1 is an x-ray $\theta$-2$\theta$ scan of a LaNiO$_3$/Ni laminate incorporating the present invention which was deposited on a Ni substrate at 400° C. in a forming gas for an initial layer deposition followed by further deposition in an Ar/O$_2$ gas mixture.
Figure 2:
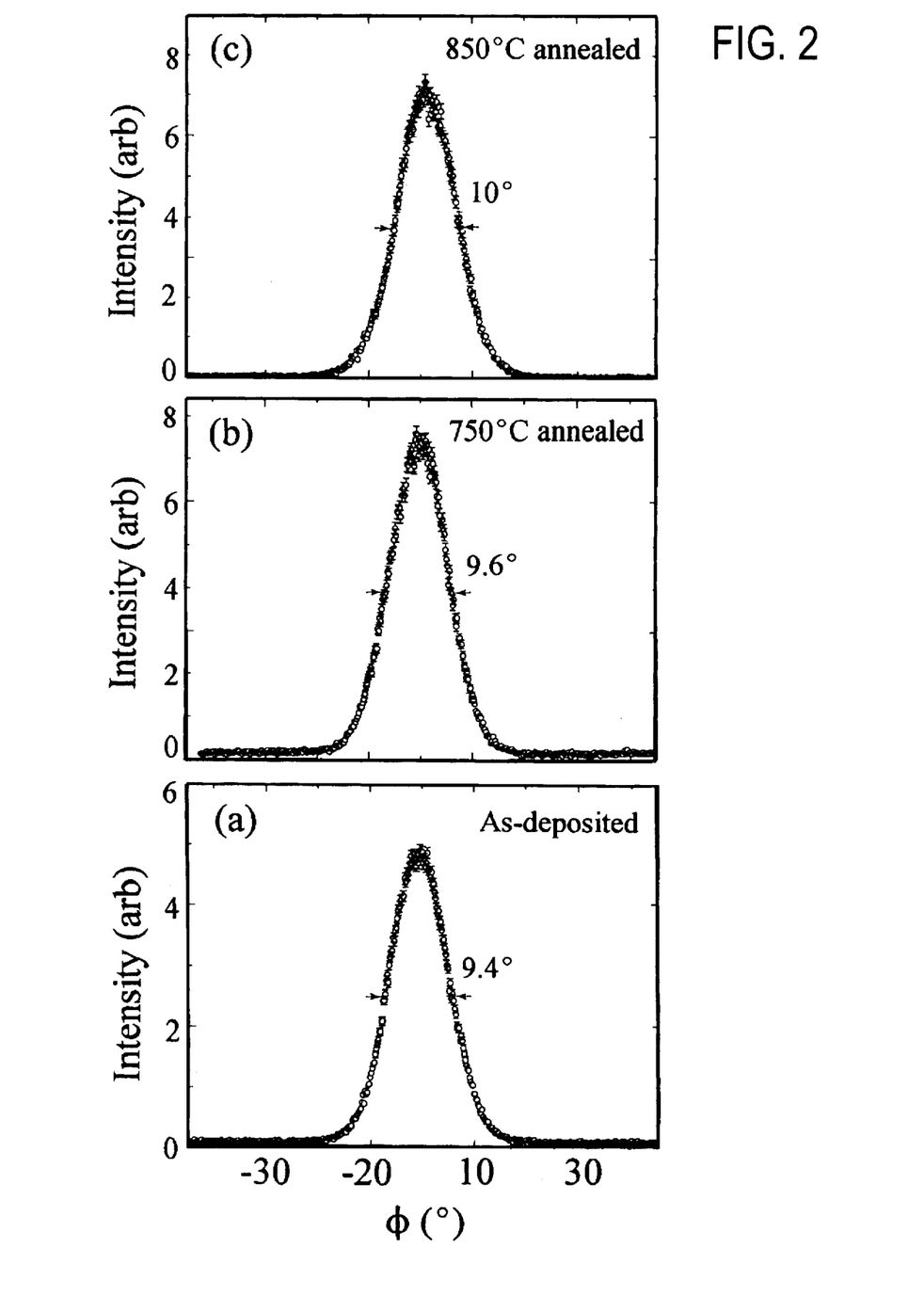
FIG. 2(a) is a x-ray $\phi$-scan through LaNiO$_3$(202) for the LaNiO$_3$ film of FIG. 1.
FIG. 2(b) is a x-ray $\phi$-scan through LaNiO$_3$(202) for the LaNiO$_3$ film of FIG. 1 post-annealed at 750° C. in 100 mT oxygen pressure for 1 hour.
FIG. 2(c) is a x-ray $\phi$-scan through LaNiO$_3$(202) for the LaNiO$_3$ film of FIG. 1 post-annealed at 850° C. in 100 mT oxygen pressure for 1 hour.

FIG. 1 shows the $\theta$-$2\theta$ x-ray diffraction scan for the $LaNiO_3$ film on a Ni substrate. Only (001) reflections are observed for the $LaNiO_3$, which indicate excellent c-axis orientation. The inset shows a $\theta$-scan through $LaNiO_3$(200), revealing out-of-plane orientation of 5° FWHM. FIG. 2(a) shows the x-ray diffraction $\phi$-scan through the $LaNiO_3$ (202) reflection with an in-plane FWHM value of 9.4°. Both the in-plane and out-of-plane alignments of the $LaNiO_3$ film are comparable to those of the (001) Ni substrate.

EXAMPLE 2

Figure 3:
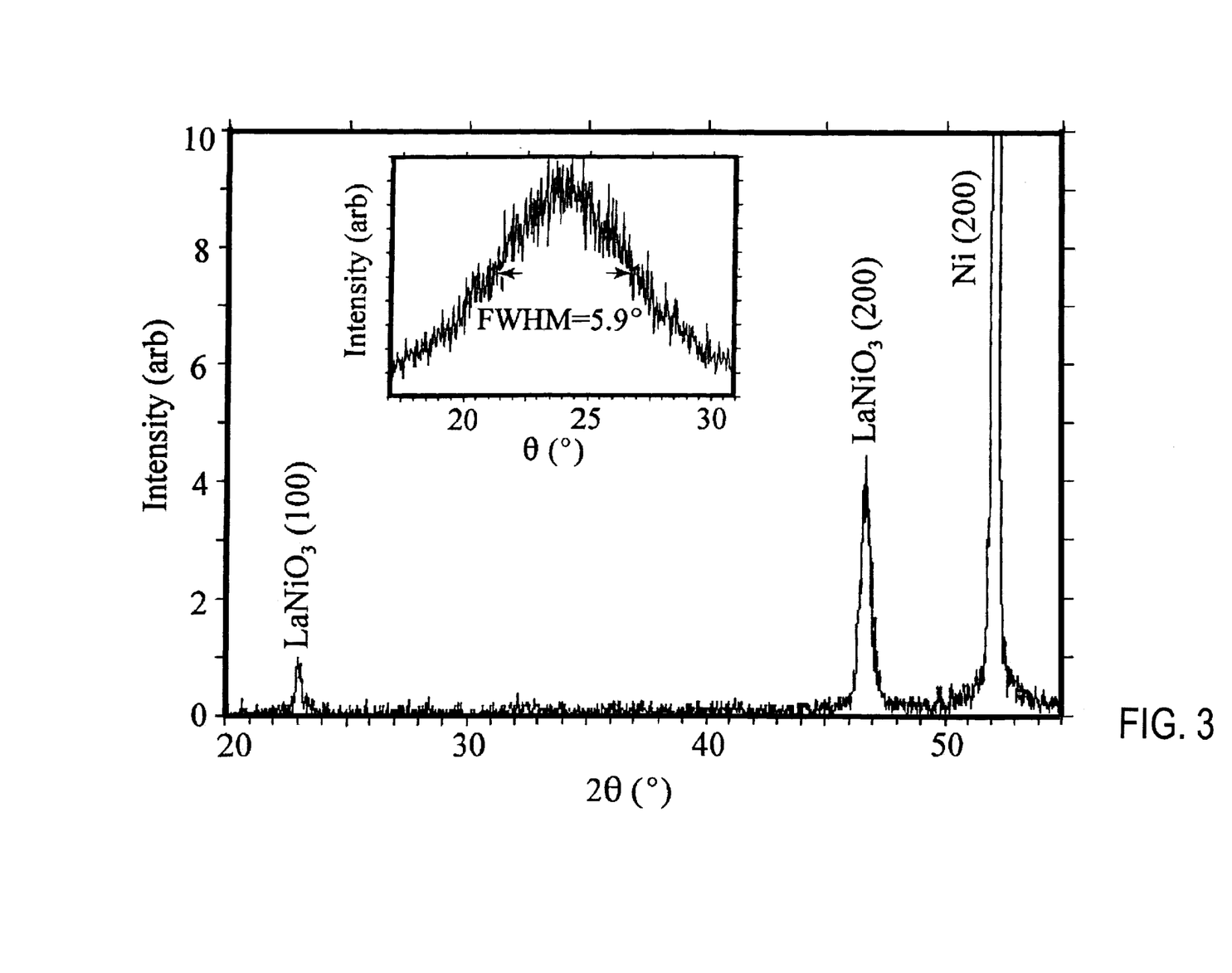
FIG. 3 is a x-ray $\theta$-2$\theta$ scan of a LaNiO$_3$ film incorporating the present invention which was deposited on a textured Ni substrate at 400° C. in pure Ar gas for the initial layer deposition followed by further deposition in Ar/O$_2$ gas.
Figure 4:
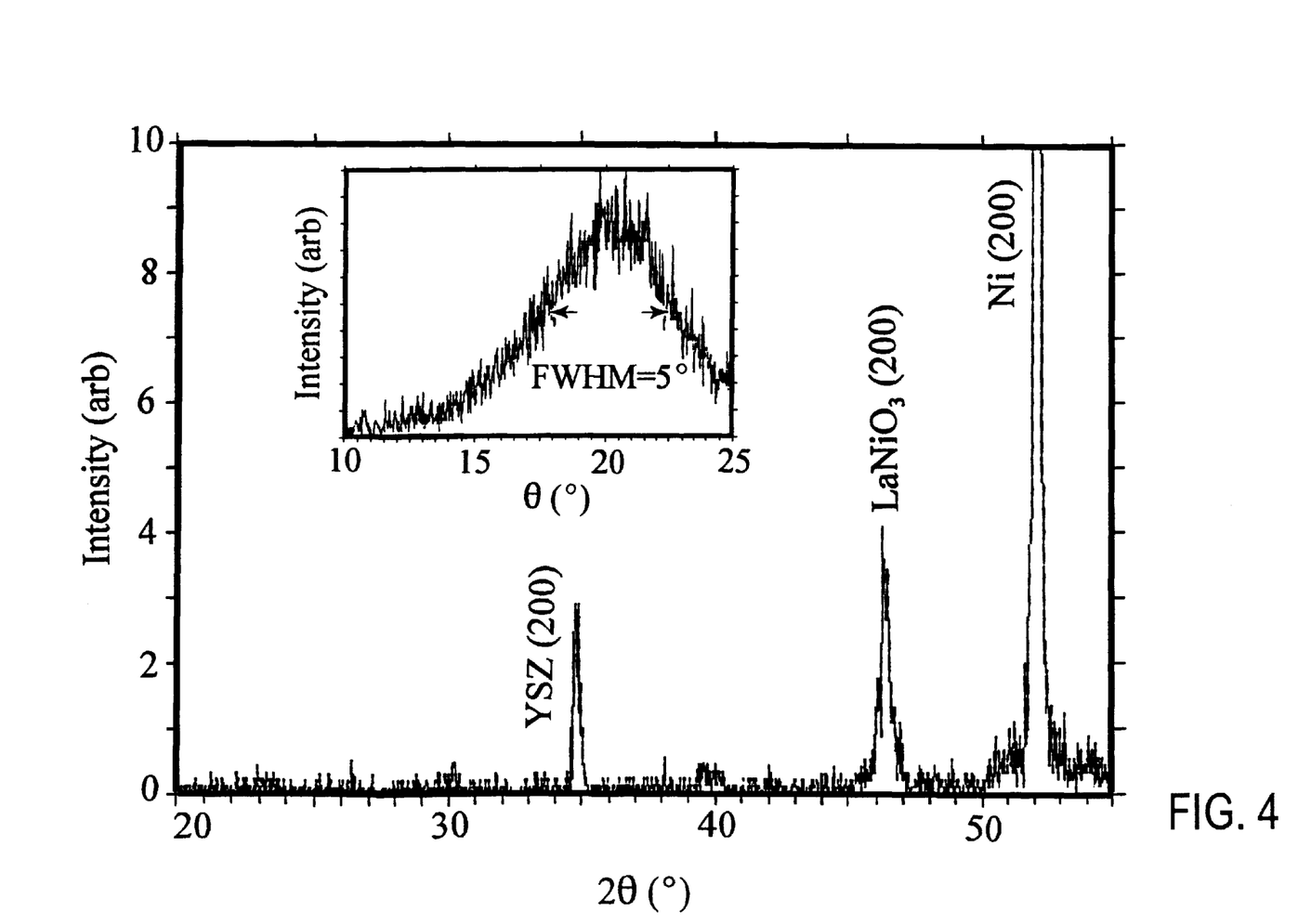
FIG. 4 is a x-ray $\theta$-2$\theta$ scan of the article of FIG. 3 having a YSZ film deposited on the LaNiO$_3$ film at 750° C. in forming gas.
Figure 5:
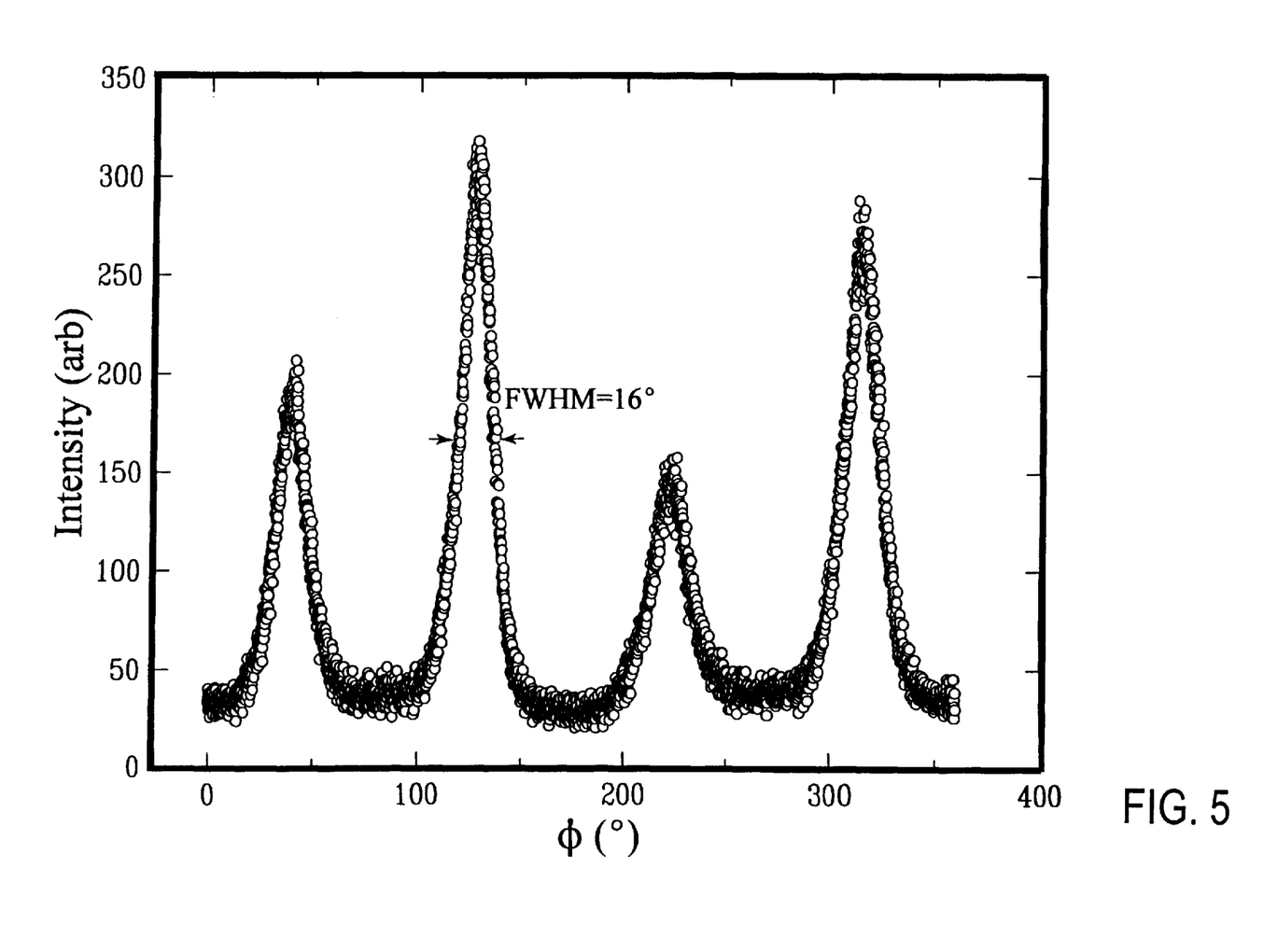
FIG. 5 is a x-ray $\phi$-scan through YSZ (202) for the YSZ/LaNiO$_3$/Ni laminate of FIG. 4.

Deposition of $LaNiO_3$ on a Ni Substrate Initially in the Presence of Pure Ar Gas The initial $LaNiO_3$ layer can also be deposited in pure Ar gas instead of the forming gas. The $\theta$-$2\theta$ scan in FIG. 3 shows good c-axis orientation for the $LaNiO_3$ film, which was deposited on the Ni substrate using pure Ar as the sputtering gas for the initial layer, followed by introducing $O_2$ gas for the subsequent film deposition. The presence of only (001) peaks shows good c-axis orientation. The inset indicates the $\theta$-scan through $LaNiO_3$ (200), revealing out-of-plane orientation of 5.9° FWHM. An in-plane c-axis oriented YSZ layer can be further deposited on the top of $LaNiO_3$ film at 750° C. in forming gas using RF magnetron sputtering. The x-ray diffraction spectra for the YSZ/$LaNiO_3$/Ni sample shown in FIG. 4 indicate the YSZ film has good c-axis orientation with FWHM value about 5°. FIG. 5 is the x-ray diffraction $\phi$-scan for the YSZ film through the (202) reflection and indicates the YSZ film has good in-plane orientation with FWHM value of 16°.

EXAMPLE 3

Annealing a Ni Substrate Having an Epitaxial $LaNiO_3$ Layer

To demonstrate the thermal stability of the $LaNiO_3$ at high temperature, the as-deposited $LaNiO_3$/Ni samples were post-annealed at 750° C. and at 850° C. in 100 mTorr oxygen partial pressure for 1 hour. X-ray analyses show the $LaNiO_3$ phase didn't decompose and both the out-of-plane and in-plane orientations for the annealed $LaNiO_3$/Ni samples did not change substantially from the as-deposited sample.

Referring particularly at FIGS. 2(a)–(c), the FWHM values of the $\phi$-scans through $LaNiO_3$ (202) are similar for the $LaNiO_3$ films which are as-deposited, 750° C. post-annealed, and 850° C. post-annealed, respectively. The FWHM values of all the three samples are about 9–10°, which means that the $LaNiO_3$ film has good in-plane orientation and that the high temperature annealing has little effect on the in-plane orientation of the film.

Figure 6:
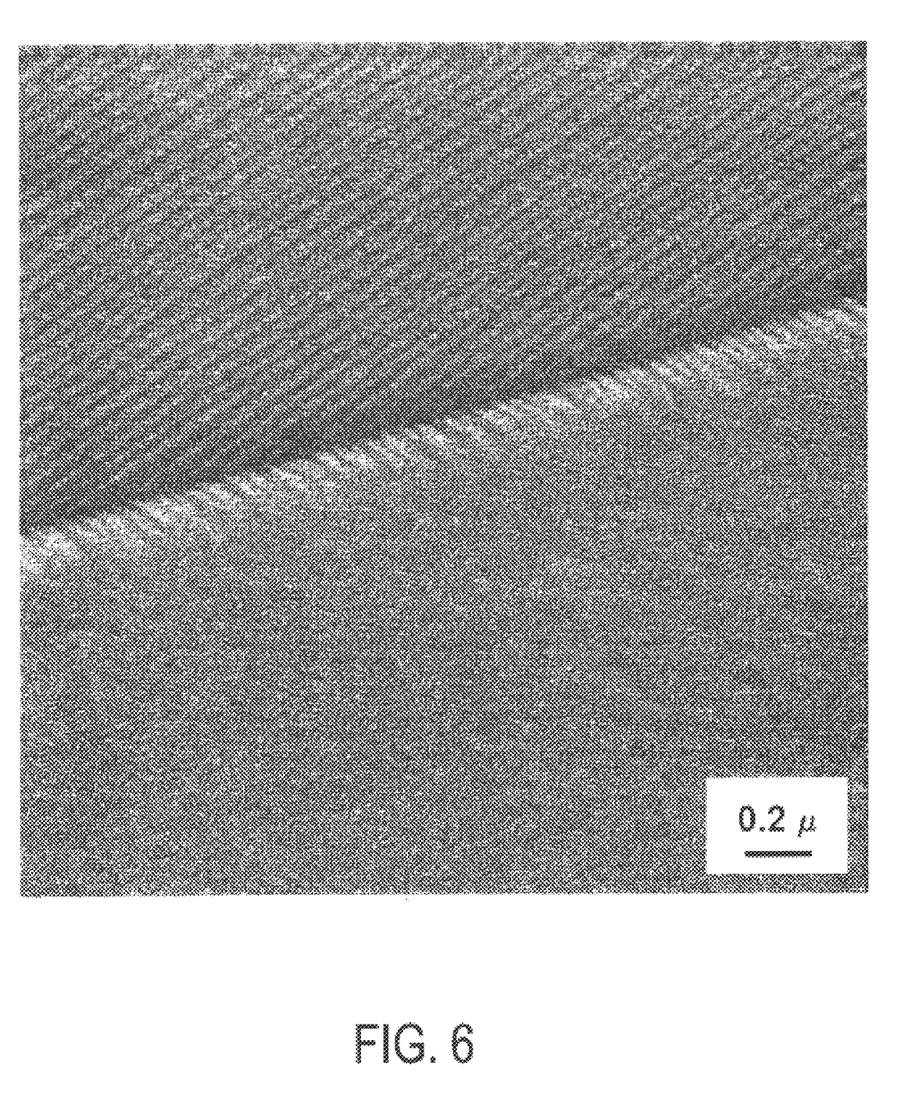
FIG. 6 is a scanning electron micrograph of a LaNiO$_3$ film incorporating the present invention which was deposited at 400° C. in forming gas for the initial layer deposition followed by further deposition in Ar/O$_2$ gas.
Figure 7:
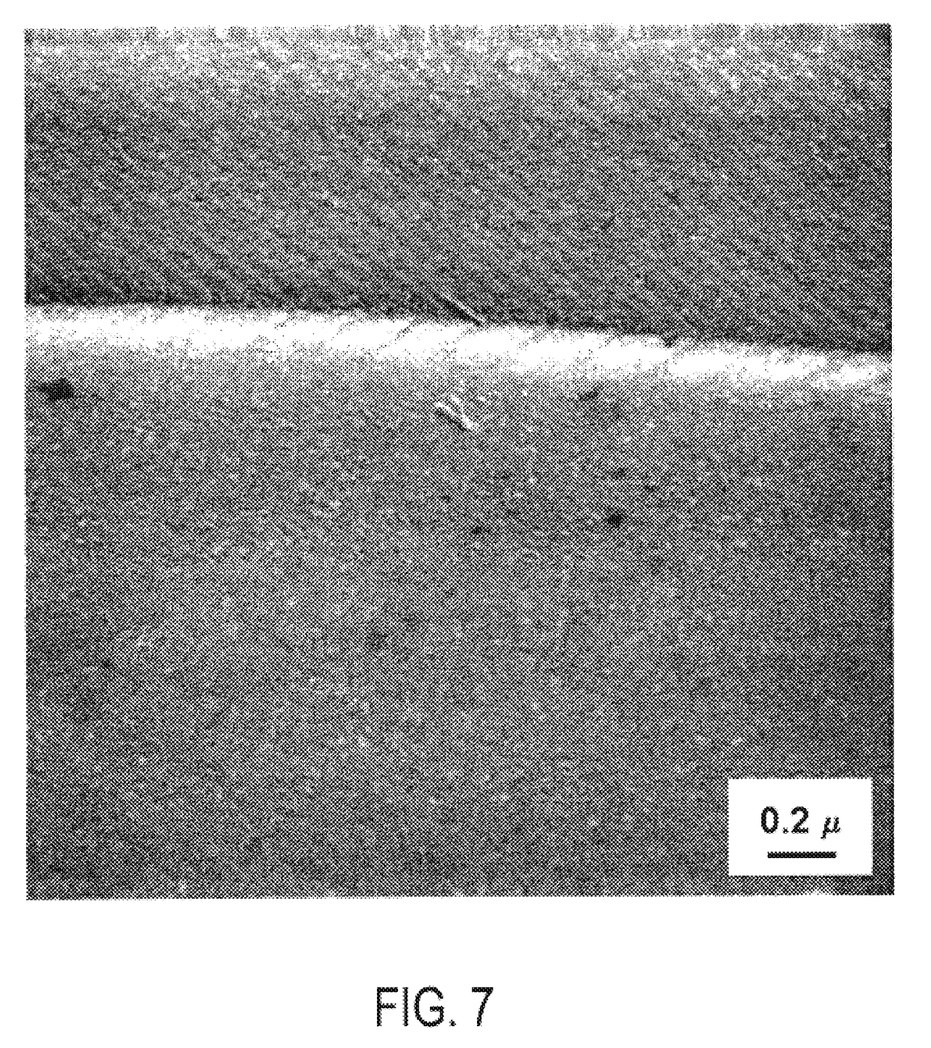
FIG. 7 is a scanning electron micrograph of the LaNiO$_3$ film of FIG. 6 which was post-annealed at 750° C. in 100 mT oxygen pressure for 1 hour.
Figure 8:
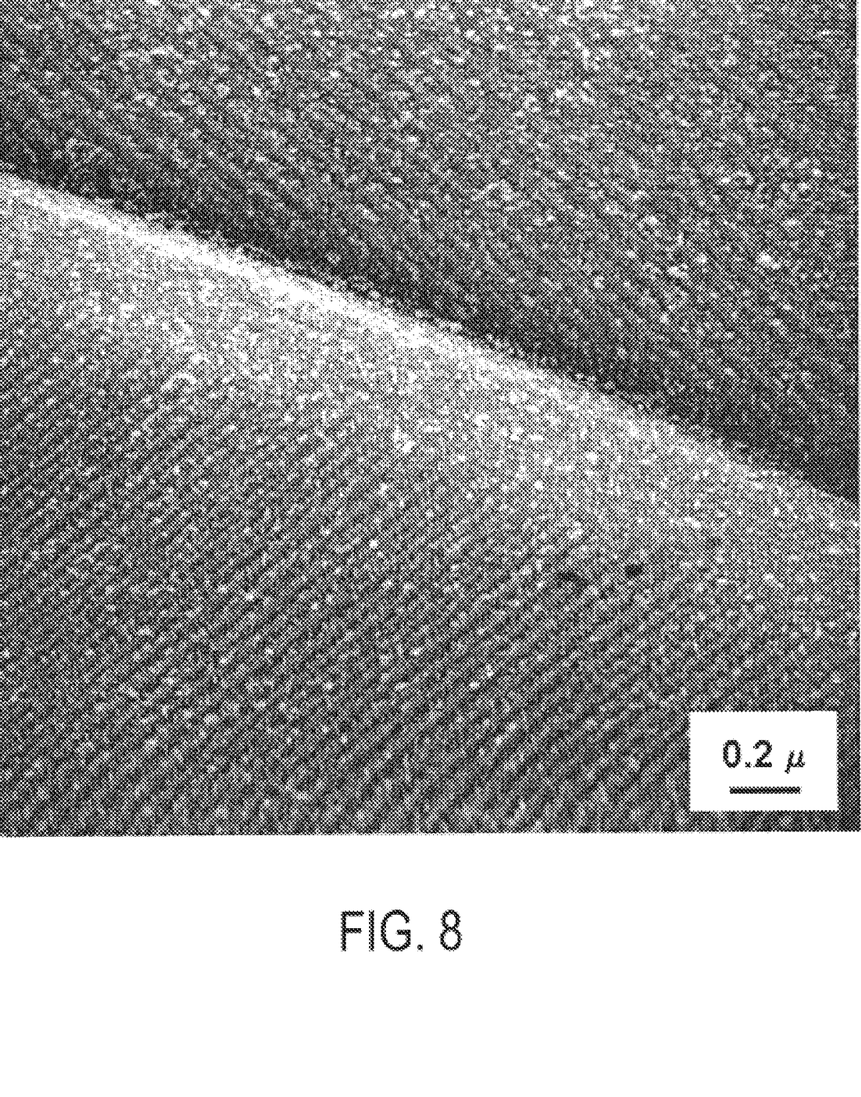
FIG. 8 is a scanning electron micrograph of the LaNiO$_3$ film of FIG. 6 which was post-annealed at 850° C. in 100 mT oxygen pressure for 1 hour.

The scanning electron micrograph, shown in FIG. 6, indicates that the as-deposited $LaNiO_3$ is a very smooth and crack-free film. As shown in FIGS. 7 and 8, the $LaNiO_3$ remained substantially smooth and crack free after post-annealing at 750° C. and at 850° C. in partial oxygen pressure. Visible features in FIG. 8 include surface traces of underlying Ni grain boundaries and surface facets due to high temperature annealing.

While there has been shown and described what are at present considered the preferred embodiments of the invention, it will be obvious to those skilled in the art that various changes and modifications can be made therein without departing from the scope of the invention defined by the appended claims.

We claim:

1. A method of depositing an epitaxial layer of an electrically conductive oxide film on a textured electrically conductive substrate comprising the steps of:

depositing an epitaxial buffer layer of a first electrically conductive oxide film on a biaxially textured electrically conductive substrate in the presence of a first gas, wherein said first electrically conductive oxide film has an electrical resistivity for stabilizing a transitioning superconductor layer mounted thereon, and said first gas is an inert gas;

substituting said first gas with a second gas; and depositing an epitaxial buffer layer of a second electrically conductive oxide film on a surface of said first electrically conductive oxide film in the presence of said second gas.

2. A method of depositing an epitaxial layer of an electrically conductive oxide film on a textured electrically conductive substrate comprising the steps of:

depositing an epitaxial buffer layer of a first electrically conductive oxide film on a biaxially textured electrically conductive substrate in the presence of a first gas, wherein said first electrically conductive oxide film has an electrical resistivity for stabilizing a transitioning superconductor layer mounted thereon;

substituting said first gas with a second gas; and depositing an epitaxial buffer layer of a second electrically conductive oxide film on a surface of said first electrically conductive oxide film in the presence of said second gas, wherein said second gas comprises $O_2$.

3. A method in accordance with claim 2, wherein said second gas comprises no more than about 10% $O_2$.

* * * * *

UNITED STATES PATENT AND TRADEMARK OFFICE
CERTIFICATE OF CORRECTION

PATENT NO. : 6,296,701 B1
DATED : October 2, 2001
INVENTOR(S) : David D. Christen, Quing He It is certified that error appears in the above-identified patent and that said Letters Patent is hereby corrected as shown below:

Title page,
OTHER PUBLICATIONS,
"R.P. Reade, et al.,... 61, 2231-233 (1992)." should read -- R.P. Reade et al.,....61, 2231-2333 (1992). --
"X. D. Wu et al.,... $O_{7-5}$" should read -- X. D. Wu et al.,... $O_{7-\delta}$ --
"T.J. Doi, et al.,... $Ca_2Cu_3O_9$" should read -- T.J. Doi, et al.,... $Ca_2Cu_3O_7$ --.

Column 2,
Line 55, after "$Cu_3O_x$," "-" should be deleted.
Line 56, after "$Cu_2O_x$," "-" should be deleted.

Column 4,
Line 59, before "Applied" "$YBa_2$- $Cu_3$-$O_7$" should read -- $YBa_2$-$Cu_3$-$O_7$-$PrBa_2Cu_3O_7$ --.

Column 5,
Line 5, after "Orientated" "TlI" should read -- $Tl_1$ --.

Column 8,
Line 26, after "about" "15-4 hours" should read -- 1-4 hours --.
Line 37, after "However" "is" should be deleted.

Column 9,
Line 66, before "is deposited" "521" should read -- Å --.

Column 10,
Line 48, after "parallel to" "(001)" should be -- ‹001› --.

Signed and Sealed this

Nineteenth Day of March, 2002

*Attest:*

*Attesting Officer*

JAMES E. ROGAN
*Director of the United States Patent and Trademark Office*